United States Patent
Yeh et al.

(10) Patent No.: US 7,057,676 B2
(45) Date of Patent: Jun. 6, 2006

(54) THIN-FILM TRANSISTOR LIQUID CRYSTAL DISPLAY SUBSTRATE

(75) Inventors: Kuang-Chao Yeh, Pingjhen (TW); Kun-Hong Chen, Taipei (TW)

(73) Assignee: AU Optronics Corp, Hsinchu (TW)

( * ) Notice: Subject to any disclaimer, the term of this patent is extended or adjusted under 35 U.S.C. 154(b) by 199 days.

(21) Appl. No.: 10/800,592

(22) Filed: Mar. 15, 2004

(65) Prior Publication Data
US 2005/0036092 A1    Feb. 17, 2005

(30) Foreign Application Priority Data
Aug. 14, 2003   (TW) .............................. 92122429 A

(51) Int. Cl.
*G02F 1/136*  (2006.01)
(52) U.S. Cl. ......................... 349/43; 349/139
(58) Field of Classification Search .................... 349/43
See application file for complete search history.

(56) References Cited

U.S. PATENT DOCUMENTS 6,713,825 B1 *   3/2004   Hwang ...................... 257/408
6,924,863 B1 *   8/2005   Nishida et al. ............. 349/141

\* cited by examiner

*Primary Examiner*—Andrew Schechter
*Assistant Examiner*—David Y. Chung
(74) *Attorney, Agent, or Firm*—Thomas, Kayden, Horstemeyer & Risley

(57) ABSTRACT

A thin-film transistor liquid crystal display (TFT-LCD) substrate mainly includes a substrate and a planarization layer thereon. The substrate is defined to form a thin-film transistor (TFT) and a contact plug thereon and the source/drain of the TFT is electrically coupled with the contact plug. The planarization layer is disposed on the substrate and the planarization layer has a via hole for penetrating the planarization layer to expose to the contact plug. The configuration of the cross-section of the via hole includes a straight edge so that the via hole is able to be formed with a less steep taper at a lateral view by reflow.

16 Claims, 4 Drawing Sheets

THIN-FILM TRANSISTOR LIQUID CRYSTAL DISPLAY SUBSTRATE

This application claims the benefit of Taiwan application Serial No. 092122429, filed Aug. 14, 2003, the subject matter of which is incorporated herein by reference.

BACKGROUND OF THE INVENTION

1. Field of the Invention

The invention relates in general to a flat display substrate, and more particularly to a thin-film transistor liquid crystal display (TFT-LCD) substrate.

2. Description of the Related Art

Thin-film transistor liquid crystal displays (TFT-LCDs) have been applied in the mainstream market nowadays owing to various advantages such as low electricity, small sizes and low radiation rather than cathode ray tubes. But as for the response rate and the reliability of pixels in TFT-LCDs, it is still flawed in a number of ways.

FIG. 1A is a cross-sectional view of a conventional TFT-LCD substrate. Referring to FIG. 1A, a conventional TFT-LCD substrate 100 mainly includes a substrate 110 and a planarization layer 140 disposed thereon. There are a buffer layer 115, a silicon dioxide layer 118, an dielectric layer 130 and a passivation layer 135 in sequence covered on the substrate 110 and the planarization layer 140 further covers thereon.

The substrate 110 is defined to form a thin-film transistor (TFT) 116 and a contact plug 120 thereon. Here, the metal layer where the gate of the TFT 116 located is known as Mantel 1, and the metal layer where the contact plug 120 located is known as Metal 2. The source/drain 125 of the TFT 116 is electrically coupled with the contact plug 120. The passivation layer 135 is disposed on the substrate 110 and the planarization layer 140 is further disposed thereon. The planarization layer 140 and the passivation layer 135 have a via hole 145 for both penetrating the planarization layer 140 and the passivation layer 135 to expose to the contact plug 120. The via hole 145 is sequentially formed with a taper 149 at a lateral view by reflow. After the process of reflow, a dielectric material layer is deposited at the inner surface of the via hole 145 and also deposited within the planarization layer 140 and the passivation layer 135 to form an Indium Tim Oxide (ITO) layer 150. As a result, the ITO layer 150 is electrically coupled with the contact plug 120, shown in FIG. 1A.

FIG. 1B is the cross-sectional view of the via hole in FIG. 1A along the direction 1B–1B'. Referring to FIG. 1B, FIG. 1B shows that the configuration of the cross-section 147 of the via hole 145 is circular shaped but curtails the profile of the ITO layer 150 which is deposited at the inner surface of the via hole 145.

FIG. 1C is an enlarged view of the identified part 1C in FIG. 1A. Referring both to FIG. 1A and FIG. 1C, the gradient of the taper 149 of the via hole 145 is determined in the process of reflow. Conventionally, the resultant taper 149 has a larger gradient, like 75 degrees. The large gradient is mainly caused by the circular configuration of the cross-section 147 of the via hole 145.

Consideration should be given here to the ITO layer 150, deposited at the inner surface of the via hole 145 and also within the planarization layer 140 and the passivation layer 135. There is a sharp-pointed indentation 159 at the junction of the ITO layer 150 and the contact plug 120. As a result, when the ITO layer 150 is deposited at the inner surface of the via hole 145 and also deposited within the planarization layer 140 and over the passivation layer 135, the depth of the ITO layer 150 at the sharp-pointed indentation 159 is thinner than other parts of the ITO layer 150. Consequently, the depth deficiency indicates that the resistance of the sharp-pointed indentation 159 is relatively larger. That is, when depth deficiency occurs, the sharp-pointed indentation 159 has a smaller cross-section area than other parts of the ITO layer 150. Since an element's resistance is inversely proportional to its cross-sectional area, the sharp-pointed indentation 159 has a larger resistance value by series connection. When the pixels of the TFT-LCD are switched on/off by the TFT 116, there is a delay for brightness response of the pixels of the TFT-LCD at the sharp-pointed indentation 159 owing to a relatively larger resistance being electrically connected by series connection therewith, which increases the response time.

Another disadvantage of the sharp-pointed indentation 159 is that the ITO layer 150 may be subject to impacts from external stress and be damaged at the sharp-pointed indentation 159 where the depth deficiency exists. Damage of the ITO layer 150 blocks the electrical coupling so that the pixels of the TFT-LCD can't be driven by the TFT 116. Light spot is consequently generated and the quality of the TFT-LCD is spoiled.

Alternately, a single planarization layer 140 can be substituted for aforesaid the planarization layer 140 and the passivation layer 135 on the contact plug 120. So, the via hole 145 only penetrates the planarization layer 140 and exposes to the contact plug 120. Further, the via hole 145 is sequentially formed with a second taper 149 at a lateral view by reflow. The gradient of the second taper 149 of the via hole 145 here is similar to the foresaid one. In that event, it is understood that the gradient of the taper 149 of the via hole 145 is determined by the shape for the configuration of the via hole 145 rather than what layer, only single planarization layer 140 or both the planarization layer 140 and the passivation layer 135, deposits on the contact plug 120.

SUMMARY OF THE INVENTION

It is therefore an object of the present invention to provide an improved thin-film transistor liquid crystal display (TFT-LCD) substrate to prevent the delay for brightness response of the pixels and improve the display quality of the TFT-LCD.

It is another object of the present invention to provide a thin-film transistor liquid crystal display (TFT-LCD) substrate mainly includes a substrate and a planarization layer thereon. The substrate is defined to form a thin-film transistor (TFT) and a contact plug thereon and the source/drain of the TFT is electrically coupled with the contact plug. The planarization layer is disposed on the substrate and the planarization layer has a via hole for penetrating the planarization layer to expose to the contact plug. The configuration of the cross-section of the via hole includes a straight edge so that the via hole is able to be formed with a less steep taper at a lateral view by reflow.

It is still another object of the present invention to provide a structure of the via hole within a planarization layer which is applied to a substrate and a planarization layer thereon. The substrate is defined to form a thin-film transistor (TFT) and a contact plug thereon and the source/drain of the TFT is electrically coupled with the contact plug. The planarization layer is disposed on the substrate and the planarization layer has a via hole for penetrating the planarization layer to expose to the contact plug. The configuration of the cross-section of the via hole includes a straight edge so that the via hole is able to be formed with a less steep taper at a lateral view by reflow.

Other objects, features, and advantages of the invention will become apparent from the following detailed description of the preferred but non-limiting embodiments. The following description is made with reference to the accompanying drawings.

DETAILED DESCRIPTION OF THE INVENTION

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like components throughout.

Figure 1A:
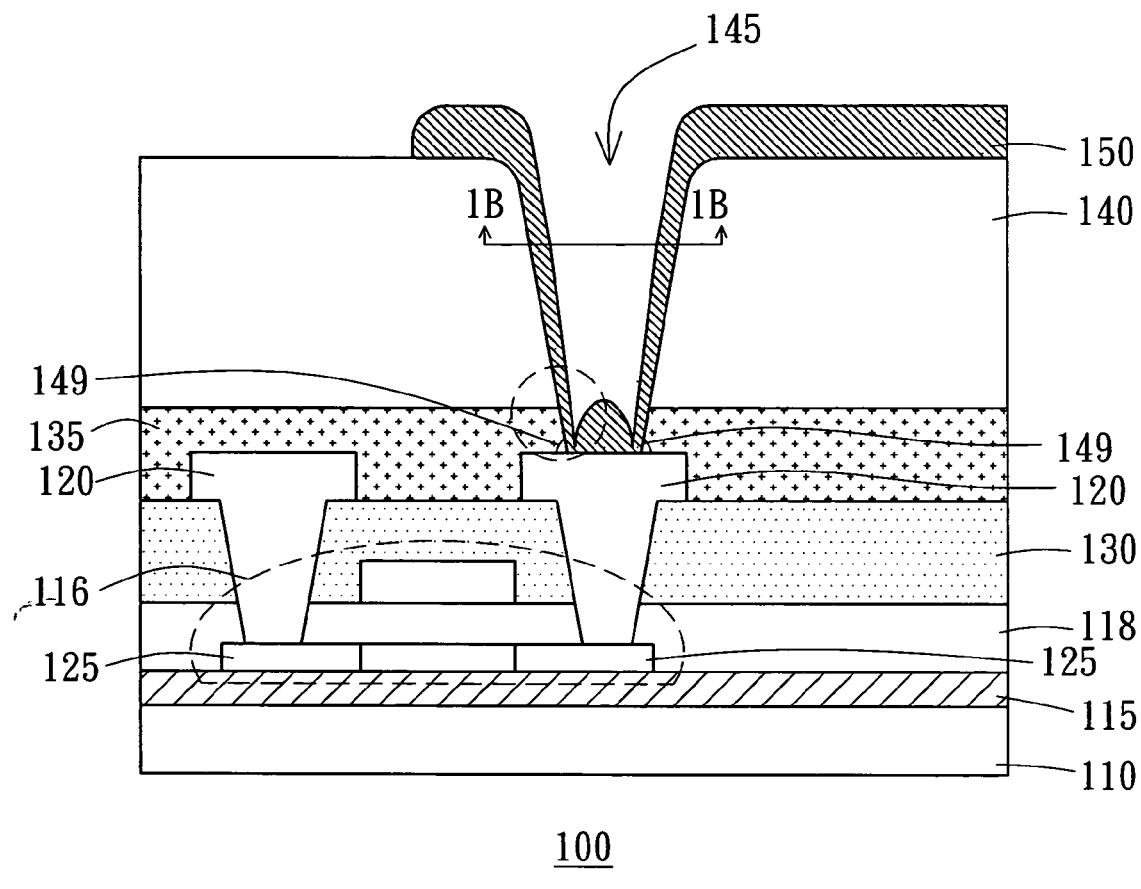
FIG. 1A (Prior Art) is a cross-sectional view of a conventional TFT-LCD substrate.
Figure 1B:
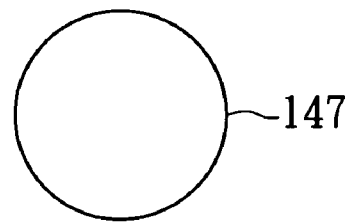
FIG. 1B (Prior Art) is the cross-sectional view of the via hole in FIG. 1A along the direction 1B–1B'.
Figure 1C:
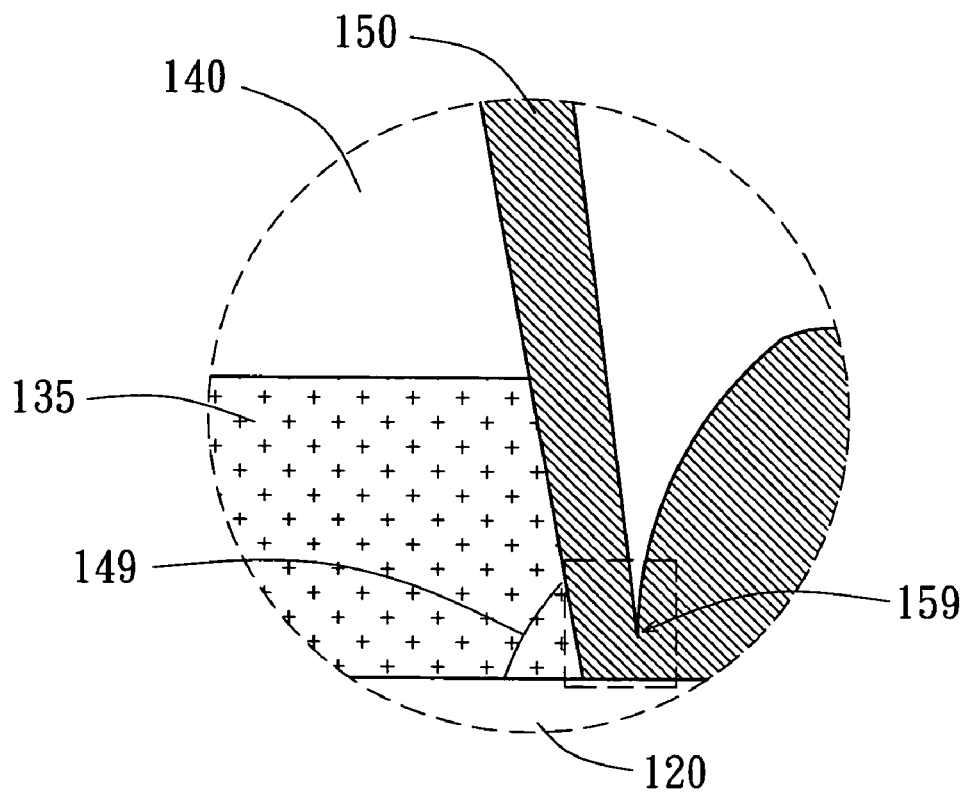
FIG. 1C (Prior Art) is an enlarged view of the identified part 1C in FIG. 1A.
Figure 2A:
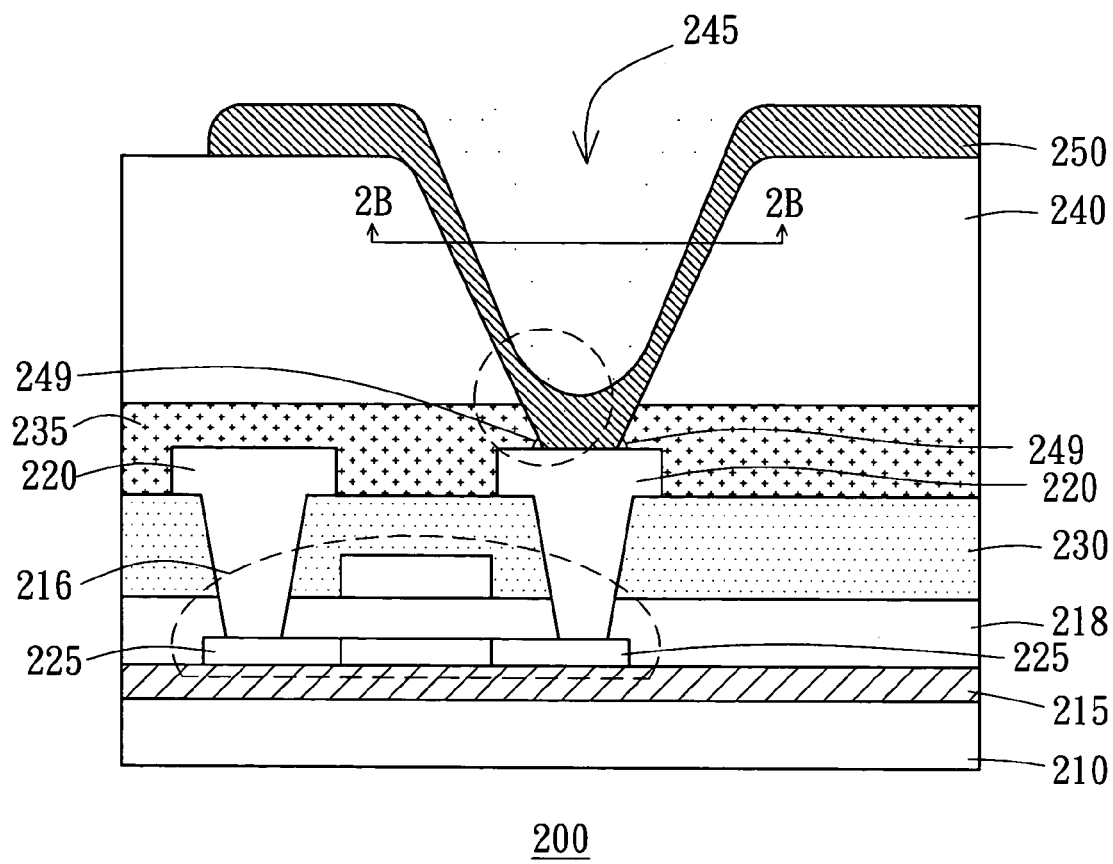
FIG. 2A is a cross-sectional schematic diagram of a TFT-LCD substrate according to a preferred embodiment of the invention.

Referring to FIG. 2A, FIG. 2A is a cross-sectional schematic diagram of a TFT-LCD substrate according to a preferred embodiment of the invention. A thin-film transistor liquid crystal display (TFT-LCD) substrate 200 includes a substrate 210, and a planarization layer 240 thereon. There are usually a buffer layer 215, a silicon dioxide layer 218, a dielectric layer 230 and a passivation layer 235 in sequence covered on the substrate 210 and the planarization layer 240 further covers thereon.

A thin-film transistor (TFT) 216 and a contact plug 220 thereon are defined on a substrate 210. Here, the metal layer where the contact plug 120 located is known as Metal 2; the source/drain 225 of the TFT 216 is electrically coupled with the contact plug 220. The passivation layer 235 is disposed on the substrate 210 and the planarization layer 240 is further disposed thereon. The planarization layer 240 and the passivation layer 235 have a via hole 245 for both penetrating the planarization layer 240 and the passivation layer 235 to expose to the contact plug 220. The via hole 245 is formed by a photolithography process and the pattern of the via hole 245 is determined in accordance with the mask used during the photolithography process and is sequentially formed with a taper 249 at a lateral view by reflow. After reflow, a dielectric material layer is deposited at the inner surface of the via hole 245 and also deposited within the planarization layer 240 to form an Indium Tim Oxide (ITO) layer 250. As a result, the ITO layer 250 is electrically coupled with the contact plug 220, shown in FIG. 2A.

Figure 2B:
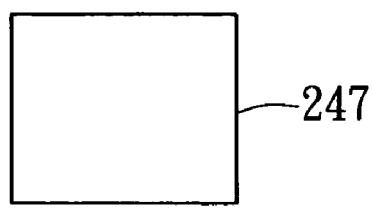
FIG. 2B is a cross-sectional view of the via hole in FIG. 2A along the direction 2B–2B'.

FIG. 2B is a cross-sectional view of the via hole in FIG. 2A along the direction 2B–2B'. One of the characteristics of the invention is that the cross section of the via hole 245 includes a substantially straight edge, such as a rectangular feature with 4 substantially straight edges. That is, via holes with circular or curved cross section are avoided. The profile of the ITO layer 250, which is deposited at the inner surface of the via hole 245, is curtailed in FIG. 2B in order to describe more obviously. Apart from the above-mentioned examples, any other mask with at least one straight edge, such as non-circular and non-curved masks, can be applied in the photolithography process to determine the configuration of the cross section 247 of the via hole 245. The cross section of the formed via hole 245 can therefore be a semicircle feature with one straight edge, a triangular feature with three straight edges, or a pentagon feature with five straight edges.

Figure 2C:
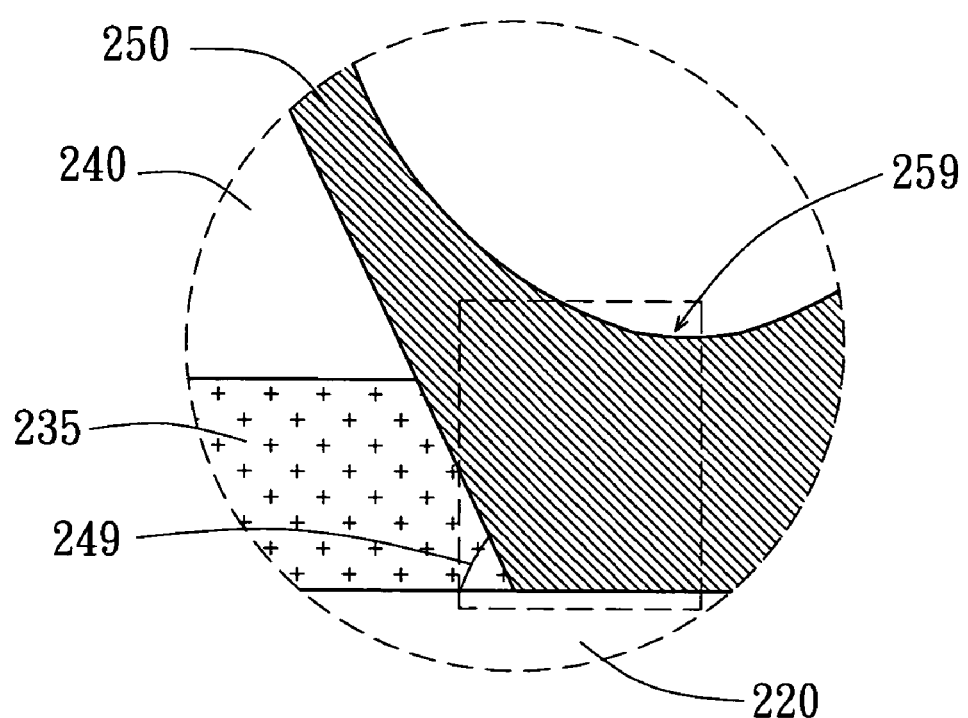
FIG. 2C is an enlarged view of portion 2C in FIG. 2A.

FIG. 2C is an enlarged view of portion 2C in FIG. 2A. Referring both to FIG. 2A and FIG. 2C, the gradient of the taper 249 of the via hole 245 is much less steep than the taper 149 as a result of the non-circular configuration of the cross-section 247 of the via hole 245. For example, the taper 249 of this invention could have an angle of about 51 degrees in real practice, which is much less than the conventional taper 149 with an angle of 75 degrees.

The much less steep taper 249 of the via hole 245 leads to a more desirable deposition for the ITO layer 250. As can be seen in FIG. 2C, there is a less sharp-pointed indentation 259 at the junction of the ITO layer 250 and the contact plug 220. As a result, when the ITO layer 250 is deposited at the inner surface of the via hole 245 and also deposited within the passivation layer 235 and the planarization layer 240, the ITO layer 250 with more even and thicker surface can be obtained. So that the aforesaid difficulties of the conventional depth deficiencies and a delay for brightness response of the pixels of the TFT-LCD at the junction of the ITO layer 250 and the contact plug 220 can be prevented.

Alternately, a single planarization layer 240 can be substituted for aforesaid the planarization layer 240 and the passivation layer 235 on the contact plug 220. So the via hole 245 penetrates the planarization layer 240 and exposes to the contact plug 220. Further, the via hole 245 is sequentially formed with a much less steep taper 249, similar to the foresaid one, at a lateral view by reflow. As a result, it is understood that the much less steep gradient of the taper 249 of the via hole 245, only single planarization layer 140 or both the planarization layer 140 and the passivation layer 135, can be obtained after reflow.

Moreover, the above-mentioned via hole structure according to the preferred embodiment of the invention can be also applied in other semiconductor structure, such as via holes within a planarization layer or a passivation layer. The via hole structures of the invention can be applied to various semiconductor manufacturing process, such as the manufacturing process of the amorphous silicon or low temperature polysilicon (LTPS).

The invention achieves the above-identified objects by providing a non-circular or non-curved photolithography mask of the via hole so that the later formed taper of the via hole is less steep and the depth of the ITO 250 is more even. As a result, the delay for brightness response of the pixels is prevented. Also, the smooth junction of the ITO layer 250 and the contact plug 220 prevents the focusing of the stress and the consequential cracking of the ITO layer 250. The quality of the TFT-LCD as a whole is improved.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A thin-film transistor liquid crystal display (TFT-LCD) substrate, comprising:
   a substrate, which is defined to form a thin-film transistor (TFT) and a contact plug thereon, wherein the source/drain of the TFT is electrically coupled with the contact plug;
   a planarization layer, which is disposed on the substrate and comprises a via hole for penetrating the planarization layer to expose to the contact plug, wherein the configuration of the cross-section of the via hole includes a straight edge so that the via hole is formed with a taper at a lateral view by reflow: and
   a dielectric material layer deposited at the inner surface of the via hole within the planarization layer and electrically coupled with the contact plug.

2. The TFT-LCD substrate according to claim 1, wherein the configuration of the cross-section of the via hole is non-circular shaped.

3. The TFT-LCD substrate according to claim 1, wherein the via hole is formed by a photolithography process and the pattern of the via hole is determined in accordance with the mask used during the photolithography process.

4. The TFT-LCD substrate according to claim 1, wherein the dielectric material layer is made of Indium Tim Oxide (ITO).

5. A thin-film transistor liquid crystal display (TFT-LCD) substrate, comprising:
   a substrate, which is defined to form a thin-film transistor (TFT) and a contact plug thereon, wherein the source/drain of the TFT is electrically coupled with the contact plug;
   a passivation layer, which is deposited on the substrate;
   a planarization layer, which is disposed on the passivation layer, wherein the passivation layer and the planarization layer have a via hole for penetrating both the passivation layer and the planarization layer to expose to the contact plug, wherein the configuration of the cross-section of the via hole includes a straight edge so that the via hole is formed with a taper at a lateral view by reflow; and
   a dielectric material layer deposited at the inner surface of the via hole within the planarization layer and electrically coupled with the contact plug.

6. The TFT-LCD substrate according to claim 5, wherein the configuration of the cross-section of the via hole is non-circular shaped.

7. The TFT-LCD substrate according to claim 5. wherein the via hole is formed by a photolithography process and the pattern of the via hole is determined in accordance with the mask used during the photolithography process.

8. The TFT-LCD substrate according to claim 5, wherein the dielectric material layer is made of Indium Tim Oxide (ITO).

9. A structure of the via hole within a planarization layer, the structure comprising:
   a substrate, which is defined to form a thin-film transistor (TFT) and a contact plug thereon, wherein the source/drain of the TFT is electrically coupled with the contact plug;
   a planarization layer, which is disposed on the substrate and comprises a via hole for penetrating the planarization layer to expose to the contact plug, wherein the configuration of the cross-section of the via hole includes a straight edge so that the via hole is formed with a taper at a lateral view by reflow; and
   a dielectric material layer deposited at the inner surface of the via hole within the planarization layer and electrically coupled with the contact plug.

10. The structure of the via hole within a planarization layer according to claim 9, wherein the configuration of the cross-section of the via hole is non-circular shaped.

11. The structure of the via hole within a planarization layer according to claim 9, wherein the via hole is formed by a photolithography process and the pattern of the via hole is determined in accordance with the mask used during the photolithography process.

12. The structure of the via hole within a planarization layer according to claim 9, wherein the structure of the via hole within a planarization layer is applied to a thin-film transistor liquid crystal display (TFT-LCD) substrate.

13. A structure of the via hole within a planarization layer and a passivation layer, the structure comprising:
   a substrate, which is defined to form a thin-film transistor (TFT) and a contact plug thereon, wherein the source/drain of the TFT is electrically coupled with the contact plug;
   a passivation layer, which is deposited on the substrate;
   a planarization layer, which is disposed on the passivation layer, wherein the passivation layer and the planarization layer have a via hole for penetrating both the passivation layer and the planarization layer to expose to the contact plug, wherein the configuration of the cross-section of the via hole includes a straight edge so that the via hole is formed with a taper at a lateral view by reflow; and
   a dielectric material layer deposited at the inner surface of the via hole within the planarization layer and electrically coupled with the contact plug.

14. The structure of the via hole within a planarization layer and a passivation layer according to claim 13, wherein the configuration of the cross-section of the via hole is non-circular shaped.

15. The structure of the via hole within a planarization layer and a passivation layer according to claim 13, wherein the via hole is formed by a photolithography process and the pattern of the via hole is determined in accordance with the mask used during the photolithography process.

16. The structure of the via hole within a planarization layer and a passivation layer according to claim 13, wherein the structure of the via hole within a planarization layer and a passivation layer applied to a thin-film transistor liquid crystal display (TFT-LCD) substrate.

* * * * *